(12) United States Patent
Mallick et al.

(10) Patent No.: US 12,410,327 B2
(45) Date of Patent: Sep. 9, 2025

(54) INK COMPOSITION FOR PRINTABLE THERMOELECTRIC MATERIALS

(71) Applicant: KARLSRUHER INSTITUT FÜR TECHNOLOGIE

(72) Inventors: Md Mofasser Mallick, Stutensee (DE); Uli Lemmer, Karlsruhe (DE); Andres Rösch, Karlsruhe (DE); Leonard Franke, Karlsruhe (DE)

(73) Assignee: KARLSRUHER INSTITUT FÜR TECHNOLOGIE, Karlsruhe (DE)

( * ) Notice: Subject to any disclaimer, the term of this patent is extended or adjusted under 35 U.S.C. 154(b) by 0 days.

(21) Appl. No.: 18/560,165

(22) PCT Filed: May 5, 2022

(86) PCT No.: PCT/EP2022/062173
§ 371 (c)(1),
(2) Date: Nov. 10, 2023

(87) PCT Pub. No.: WO2022/238233
PCT Pub. Date: Nov. 17, 2022

(65) Prior Publication Data
US 2024/0270989 A1  Aug. 15, 2024

(30) Foreign Application Priority Data

May 11, 2021  (EP) ..................... 21173254

(51) Int. Cl.
*C09D 11/03* (2014.01)
*B41M 7/00* (2006.01)
(Continued)

(52) U.S. Cl.
CPC ............ *C09D 11/03* (2013.01); *B41M 7/009* (2013.01); *C09D 11/52* (2013.01); *H10N 10/01* (2023.02); *H10N 10/852* (2023.02)

(58) Field of Classification Search
None
See application file for complete search history.

(56) References Cited

U.S. PATENT DOCUMENTS

2019/0035996 A1*  1/2019  Chen ..................... H10N 10/01

FOREIGN PATENT DOCUMENTS

| CN | 109713115 B | 6/2020 |
| EP | 3796404 A1 | 3/2021 |

OTHER PUBLICATIONS

Patent Cooperation Treaty (PCT), International Search Report for Application PCT/EP2022/062173 filed on May 5, 2022, mailed Aug. 9, 2022, International Searching Authority, EP.
(Continued)

*Primary Examiner* — Eli S Mekhlin
(74) *Attorney, Agent, or Firm* — McDonald Hopkins LLC

(57) ABSTRACT

The present invention relates to an ink composition comprising a precursor material for a thermoelectric material, a precursor material for an inorganic binder comprising a mixture of Cu, Se and optionally S powder, an organic solvent and an organic binder. The present invention also relates to a Cu—Se—S-based ink composition for printable thermoelectric materials, comprising a mixture of Cu, Se and S powders. Furthermore, the present invention relates to a flexible printed thermoelectric material obtainable by printing the ink of the present invention. The present invention further relates as well as to a flexible printed high power density thermoelectric generator, heat flux sensor and thermoelectric cooler comprising the flexible printed thermoelectric material and its use, particularly for large scale applications. Further, the present invention also relates to a method for producing the flexible printed thermoelectric material.

Figure 1:
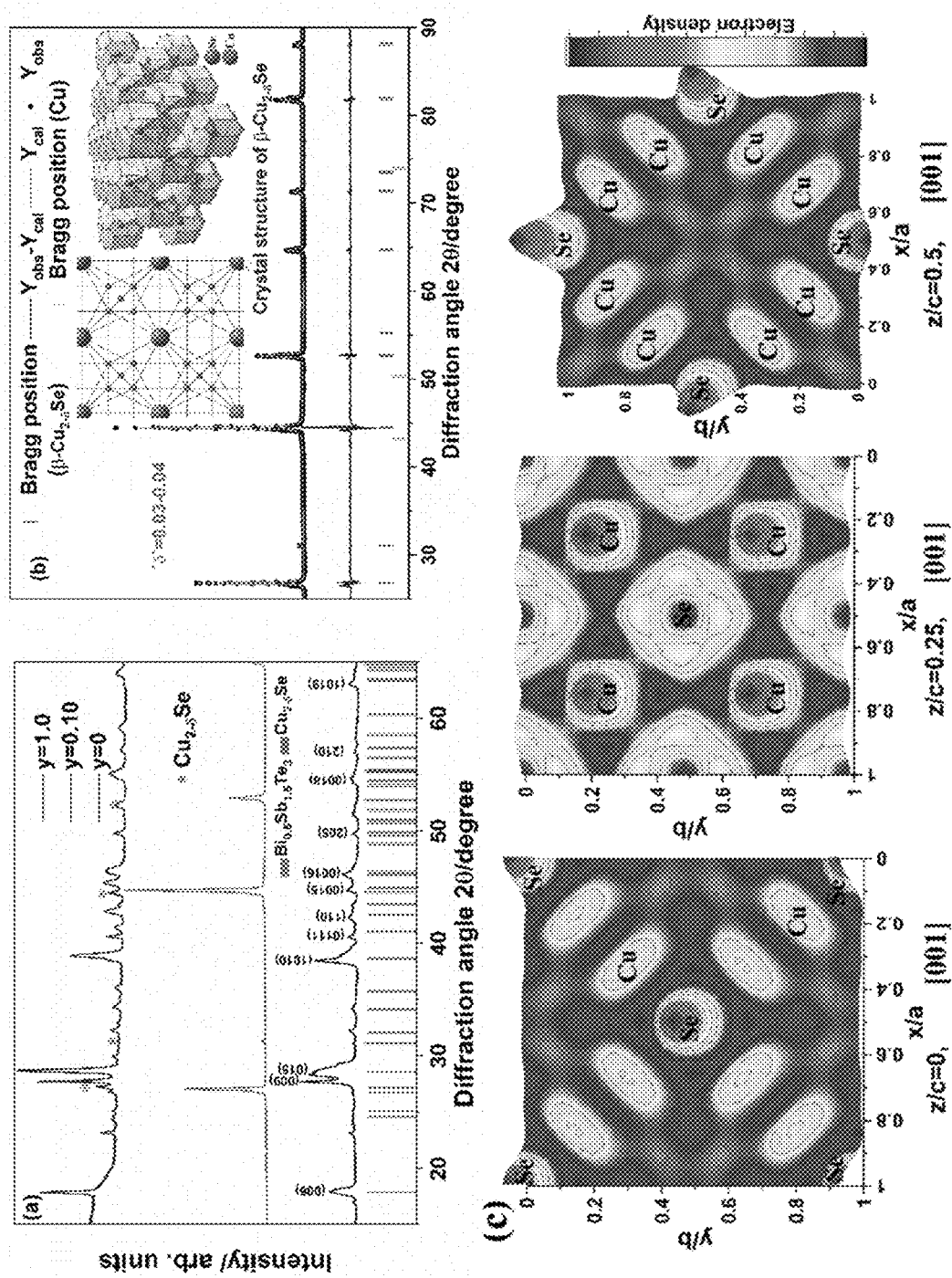
Figure 1:
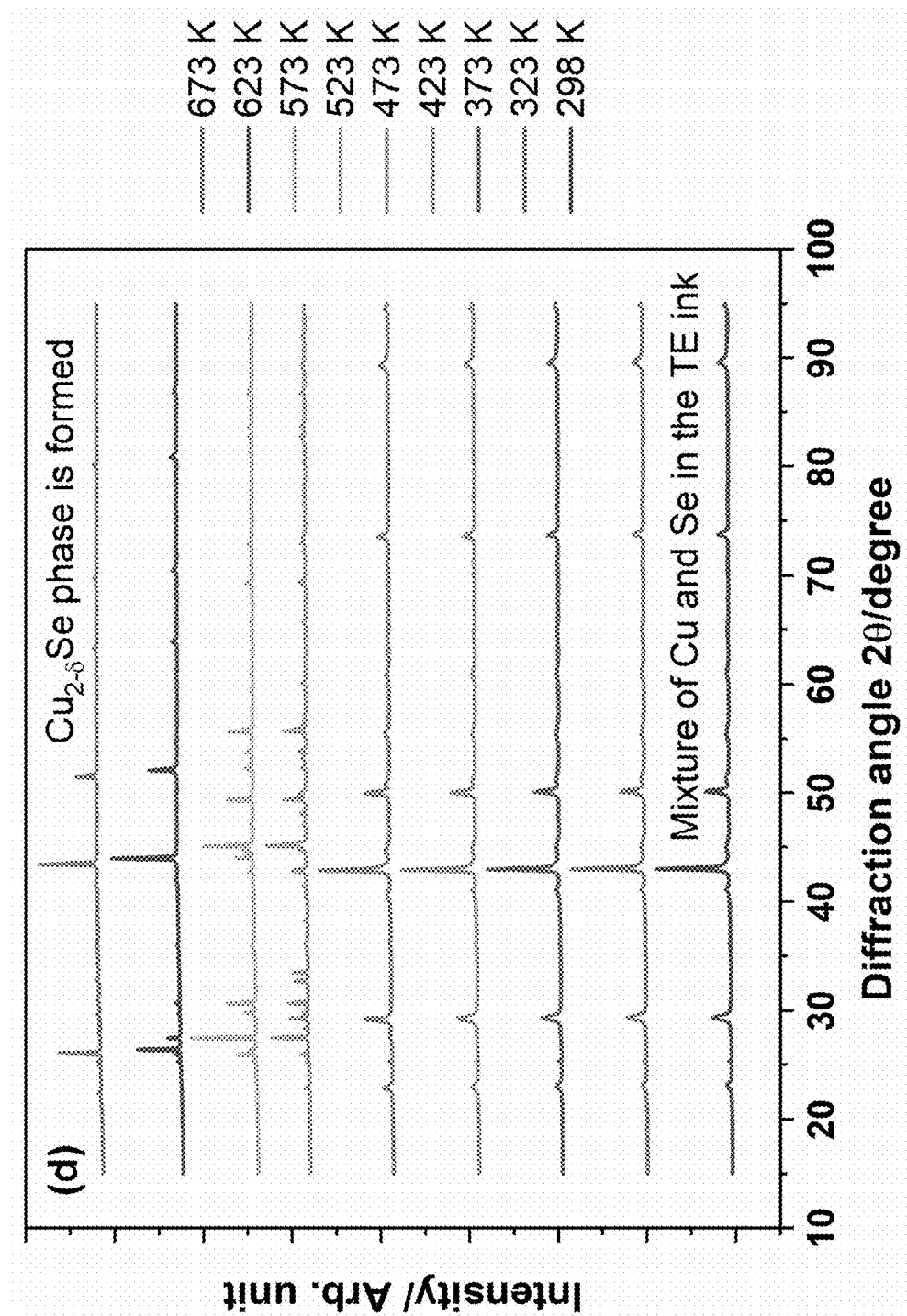

18 Claims, 12 Drawing Sheets p-type 0.9(Bi$_{0.5}$Sb$_{1.5}$Te$_3$)-0.1(IB)

n-type 0.9(Bi$_2$(SeTe)$_3$)-0.1(IB)

(51) Int. Cl.
*C09D 11/52* (2014.01)
*H10N 10/01* (2023.01)
*H10N 10/852* (2023.01)

(56) References Cited

OTHER PUBLICATIONS

Zhao et al., "Enhanced thermoelectric performance through tuning bonding energy in Cu 2 Se 1-x-S-x Liquid-like Materials," Chemistry of Materials, vol. 29, No. 15, 2017, pp. 6367-6377.

Mofasser et al., "Enhancing the thermoelectric performance of a p-type half-heusler alloy, HfCoSb by incorporation of a band-matched chalcogenide, Cu 2 Te," Journal of Materials Chemistry A, vol. 6, No. 30, 2018.

Mofasser et al., "New frontier in printed thermoelectics: formation of [beta]-Ag 2 Se through thermally stimulated dissociative adsorption leads to high ZT," Journal of Materials Chemistry A., vol. 8, No. 32, 2020.

\* cited by examiner n-type 0.9(Bi$_2$(SeTe)$_3$)-0.1(IB)

p-type 0.9(Bi$_{0.5}$Sb$_{1.5}$Te$_3$)-0.1(IB)

INK COMPOSITION FOR PRINTABLE THERMOELECTRIC MATERIALS

CROSS-REFERENCE TO RELATED APPLICATION

This application is a 35 U.S.C. 371 national stage filing of PCT Application No. PCT/EP2022/062173 filed on May 5, 2022, entitled "INK COMPOSITION FOR PRINTABLE THERMOELECTRIC MATERIALS," which claims priority to European Patent Application No. 21173254.0, filed on May 11, 2021, each of which are incorporated herein in their entirety by reference.

The present invention relates to an ink composition for printable thermoelectric materials comprising a precursor material for a thermoelectric material, a precursor material for an inorganic binder comprising a mixture of Cu, Se and optionally S powder, an organic solvent and an organic binder. The present invention also relates to a Cu—Se—S-based ink composition for printable thermoelectric materials, comprising a mixture of Cu, Se and S powders, an organic solvent and an organic binder. Furthermore, the present invention relates to a flexible printed thermoelectric material obtainable by printing the ink of the present invention. The present invention further relates to a flexible printed high power density thermoelectric generator comprising the flexible printed thermoelectric material and its use, particularly for large scale applications. Further, the present invention also relates to a method for producing the flexible printed thermoelectric material.

The technical field of the present invention generally relates to printable thermoelectric materials particularly for large scale applications. Thermoelectric (TE) is a simple technology with no moving components which can be used to recover waste heat into electricity, to detect heat flow (heat flux sensor) and to control the local temperature of a system. Currently, approximately 65% of consumed energy is being wasted as heat, hence converting the waste heat into electricity via a thermoelectric generator (TEG), can be a significant boost in the renewable energy sector. A heat flux sensor is used to detect heat flow out of an insulating system. It is also employed for safety measures in battery applications or other electronic components, such as monitoring the heat flow out of the system and preventing them from exploding. Also, thermoelectric coolers (TECs) have been used to maintain the local temperature of different systems (e.g., microelectronic devices, sensitive chemicals). Unlike conventional bulk TE materials, high performance printable TE materials could offer low production cost, shape versatility and high output power density 2D/3D devices.

So far, most of the research on thermoelectricity has been focused on the design of TE materials and improving their figure-of-merit $ZT=(S^2\sigma/\kappa)\cdot T$, where S represents the Seebeck coefficient, $\sigma$ represents the electrical conductivity, K represents the thermal conductivity, and T represents the absolute temperature. Higher ZT values indicate an excellent performance of the TE material. However, less effort has been put forward to develop cost-effective TE devices. Even though a large number of high-performance TE materials with ZT>1 have already been developed, it is still a challenge to produce low-cost and high output power density TE devices using bulk materials due to large quantities of materials used in the manufacturing process. The manufacturing of such TE devices also relies on elaborate and time consuming processes, often involving several steps. Furthermore, TE devices made of bulk materials are generally found to be in cuboid or other symmetric shapes, making it difficult to be integrated into non-flat surfaces of different systems.

Printing technology can be implemented in order to overcome the limitations associated with conventional TE devices. High performance printable TE materials could offer low production cost, shape-versatility, and high output power density devices for rapid manufacturing of TE devices for large scale applications. However, printed materials with good printability and ZT≥1 are difficult to be designed. The TE parameters, in particular $\sigma$, of inorganic based printed materials, are affected during ink processing, resulting in low ZT. Organic-based materials with good printability are known, but they exhibit low performance mainly due to very low S. Also, for fabricating an efficient printed TE device, n- and p-type printed materials with similar performance are required. Among the conventional TE materials, $(SbBi)_2Te_3$ based materials are commonly used for bulk TE devices. Also, $(SbBi)_2Te_3$ based n- and p-type bulk TE materials have been targeted extensively to make them printable preserving their high performance at room temperature. Unfortunately, the disruption of charge carrier transport at the grain boundaries due to binders and additives lowers the overall ZT.

A ZT of approximately 1 was realized in a $Sb_2Te_3$ based printed film through connecting $Bi_{0.4}Sb_{1.6}Te_3$ particles with melted Te. However, an intermediate post-printing high-pressure treatment is involved in processing. In a screen-printed $Bi_2Te_3$ film a power factor value of 3.63 $\mu Wcm^{-1}K^{-2}$ with ZT of approximately 0.2 was attained through interface modification. In inkjet printed $Bi_2Te_3$ and $Bi_{0.5}Sb_{1.5}Te_3$ flexible nanowire films, power factors of 1.80 $\mu Wcm^{-1}K^{-2}$ and 1.10 $\mu Wcm^{-1}K^{-2}$ are achieved through post-print thermal annealing respectively. In other reports, ZT values of 0.3 and 0.2 are attained in pressure treatment free p-type $Sb_2Te_3$ based films. $Bi_2Te_3$ based p- and n-type painted/3D printed TE films with ZT of approximately 1 were also reported using an inorganic binder made of $Sb_2Te_3$-ChaM solution. However, the synthesis process is complicated and requires several steps. A further draw-back is that all the above mentioned printed TE materials do not have good flexibility.

Thus, there is still no pressure treatment free high performance environmentally stable flexible printable TE material for device applications available. This is mainly due to either low $\sigma$ or poor printability. $(SbBi)_2Te_3$-based n- and p-type materials are known to exhibit good TE performance at room temperature, but poor printability. Furthermore, an increase in resistivity during ink processing limits their use in printing technologies. Hence, it has been a challenge to develop flexible and environmentally stable high-efficiency inorganic TE materials with good printability, a high power factor ($S^2\sigma$) and low thermal conductivity ($\kappa$).

Based on the above, the object of the invention is to provide an environmentally stable and highly efficient printable inorganic based TE material with an improved TE performance, and which is capable to reproducibly and efficiently provide high power density, yet low cost flexible TE devices.

According to the present invention, the above object is achieved by providing an ink composition for printable thermoelectric materials as characterized in claim 1. The above object is further achieved by providing a Cu—Se—S based ink composition for printable thermoelectric materials as characterized in claim 7. The above object is also achieved by a method for producing a flexible printed thermoelectric material as characterized in claim 8. In addition, the above object is achieved by a flexible printed thermoelectric material as characterized in claim 12. Furthermore, the above object is achieved by providing a flexible printed thermoelectric generator as characterized in claim 14 as well as its use as characterized in claim 16. Preferred embodiments of the present invention are set out in the dependent claims.

The present invention is based on a new strategy for producing a flexible printed thermoelectric material comprising an inorganic binder, which bridges the grains of TE materials with non-stoichiometric $\beta$-$Cu_{2-\delta}$Se through a facile printing-sintering process. Therefore, unlike conventional inorganic powder based printed films containing grain boundaries, interruption of carrier transportation at the grain boundaries due to binders and additives has been minimized in the present invention, which results in high advantageous electrical conductivity $\sigma$, and thus in an improved TE performance.

Specifically, the present invention provides an ink composition for printable thermoelectric materials, comprising a precursor material for a thermoelectric material, a precursor material for an inorganic binder comprising a mixture of Cu, Se and S powder, an organic binder, and an organic solvent, wherein the molar ratio of the Cu powder to the total of Se and S powder combined is 2:1 and wherein the molar ratio of the Se powder to the S powder expressed by the formula $(1-x)$Se:xS is in the range of $0 \leq x \leq 0.20$. Furthermore, the weight ratio of the precursor material for a thermoelectric material to the precursor material for an inorganic binder expressed as [(1-y) thermoelectric material:y inorganic binder] is in the range of $0 < y \leq 0.25$.

Preferably, the precursor material for a thermoelectric material is a precursor material for a p-type thermoelectric material, preferably a powder of Bi—Sb—Te alloy having a molar ratio of Te to the total of Bi and Sb combined of 3:2.

More preferably, the precursor material for a thermoelectric material is a powder of Bi—Sb—Te alloy having a molar ratio of the Te powder to Bi powder to Sb powder of 3:0.5:1.5.

The ink composition according to the present invention may further comprise at least one additive selected from siliceous or siliceous and/or aluminous materials, preferably fumed silica, and/or a liquid rheology dispersing additive.

The particle size of each of the Cu, Se and S powder is preferably 500 µm or less.

According to the present invention, the weight ratio of the precursor material for a thermoelectric material to the precursor material for an inorganic binder expressed as [(1-y) thermoelectric material:y inorganic binder] is preferably in the range of $0.01 \leq y \leq 0.20$, further preferably in the range of $0.05 \leq y \leq 0.10$.

The present invention further provides a Cu—Se—S-based ink composition for printable thermoelectric materials, comprising a mixture of Cu, Se and S powders, an organic binder and an organic solvent, wherein the molar ratio of the Cu powder to the total of Se and S powder combined is 2:1 and wherein the molar ratio of the Se powder to the S powder expressed by the formula $(1-x)$Se:xS is in the range of $0 \leq x \leq 0.20$.

In addition, the present invention provides a method for producing a flexible printed thermoelectric material, comprising the steps of:
 providing the ink composition according to the present invention;
 printing the ink composition onto a substrate; and
 sintering the ink composition at a temperature of 200° C. to 500° C. for at least 60 seconds.

The step of sintering the ink composition may be performed by photonic flash sintering the ink composition, followed by pressing the printed film after sintering.

Preferably, the step of providing the ink composition comprises wet ball-milling of the precursor material for a thermoelectric material, the precursor material for an inorganic binder, the organic binder and the organic solvent.

The step of printing the ink composition onto the substrate is preferably carried out by at least one selected from the group consisting of screen printing, doctor blading, airbrushing, inkjet printing and 3D-printing.

In a further aspect, the present invention provides a flexible printed thermoelectric (TE) material obtainable by printing the ink composition according to the present invention onto a substrate and sintering the ink composition at a temperature of 200° C. to 500° C., wherein the printed thermoelectric material comprises a $Cu_{2-\delta}S_xSe_{1-x}$ phase with $0 \leq x \leq 0.20$ and $0 \leq \delta \leq 0.15$.

The flexible printed thermoelectric material preferably has a thickness of 10 to 250 µm.

The present invention further provides a flexible printed thermoelectric generator (print-TEG) comprising said flexible printed thermoelectric material as p-type legs.

According to a preferred embodiment, the flexible printed TEG further comprises n-type legs made from an Ag—Se-based ink composition for n-type printable thermoelectric materials.

Said flexible printed TEG can be used in heat-flux sensor applications, in waste heat recovery applications, or in cooling applications integrated with wearable materials to maintain or lower a body temperature.

According to the present invention, high room temperature figure-of-merit 2D/3D printable TE materials have been developed by bridging the grains of TE materials with non-stoichiometric $\beta$-$Cu_{2-\delta}$Se based inorganic binder (IB) through a facile printing-sintering process. In particular, the present invention provides a very easy and fast method of producing printable TE materials, which does not involve complicated multistep processes. Moreover, the printable TE material is highly reproducible, and the prepared printed materials are environmentally stable. The resulting flexible printed TE materials have surprisingly a very high TE power factor and ZT at room temperature. Using the TE material of the present invention for p-type legs, a printed flexible TE generator can be manufactured showing a very high maximum output power density.

The present invention including preferred embodiments will now be described in more detail along with the accompanying figures.

The figures show:

FIG. 1: (a) Room temperature XRD patterns of the films (1-y)BST-(y)IB for y=0, y=0.10 and y=1. (b) XRD pattern with Rietveld refinement results of the film with y=1 at RT. (c) Fourier maps at different planes along [001] direction for electron density distributions of the atoms, Cu and Se, for $\beta$-$Cu_{2-\delta}$Se phase. (d) Temperature dependent XRD patterns of the film with y=1.

Figure 2:
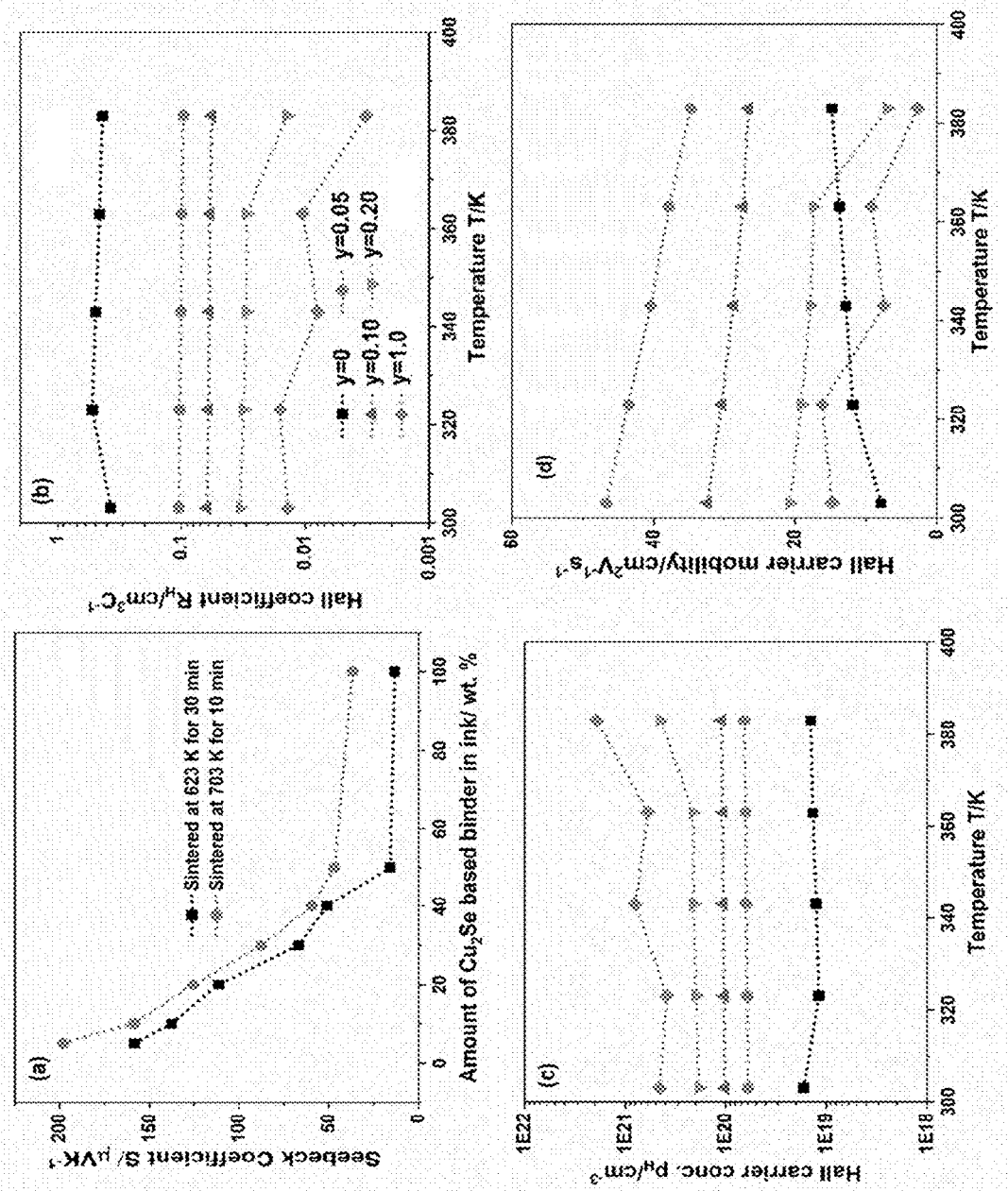

FIG. 2: (a) Composition-dependent Seebeck coefficient of the printed films of Example 1 sintered at 623 K and 703 K. (b) Temperature-dependent Hall coefficient ($R_H$), (c) Hall carrier concentration ($\eta_H$) and (d) Hall carrier mobility ($\mu_H$) of the printed films of Example 1.

Figure 3:
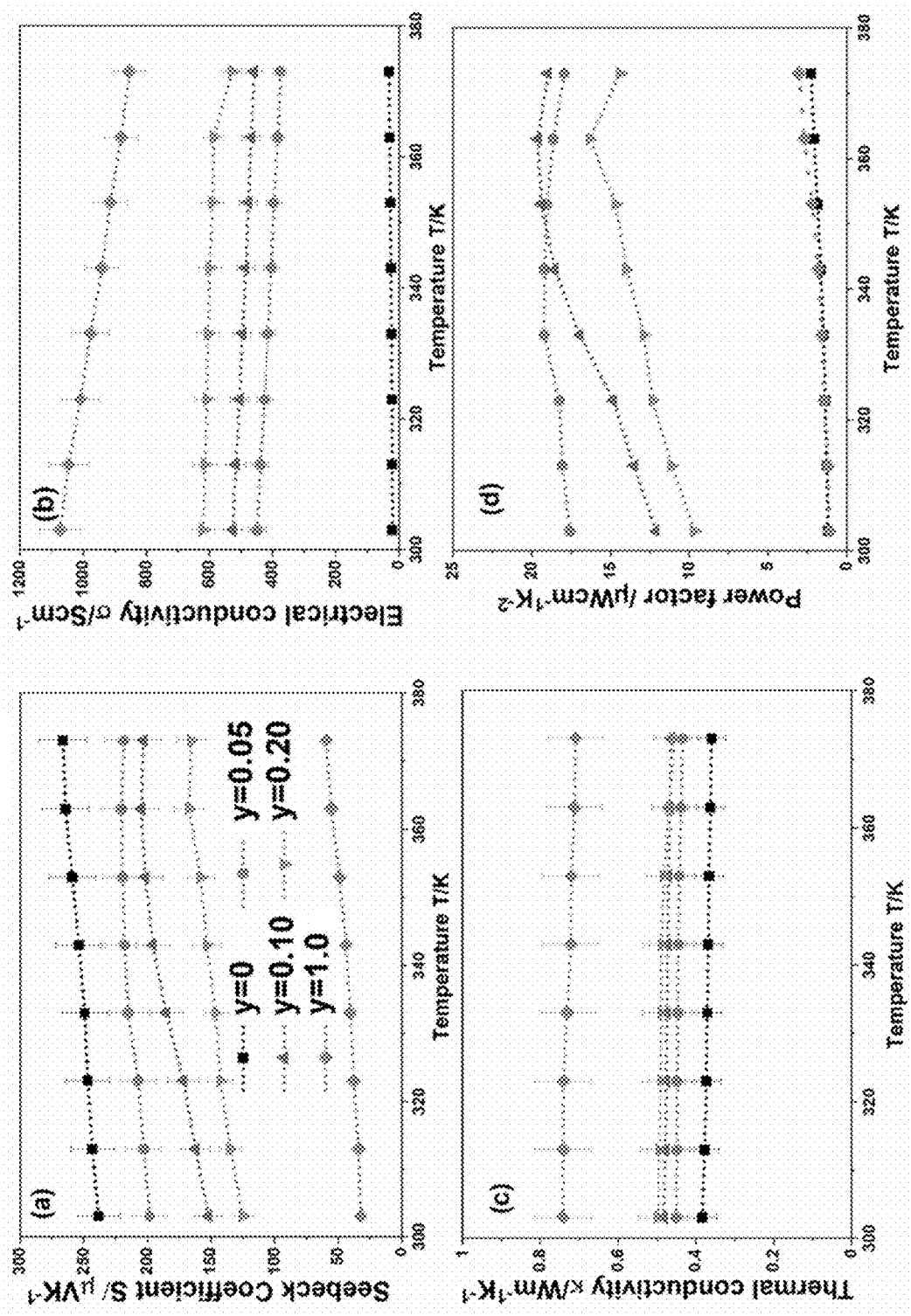

FIG. 3: Variation of thermoelectric parameters S (a), $\sigma$ (b) and $\kappa$ (c) with temperatures from 300 to 400 K of the films of Example 1. (d) Temperature-dependent power factor $S^2\sigma$ for all films of Example 1.

Figure 4:
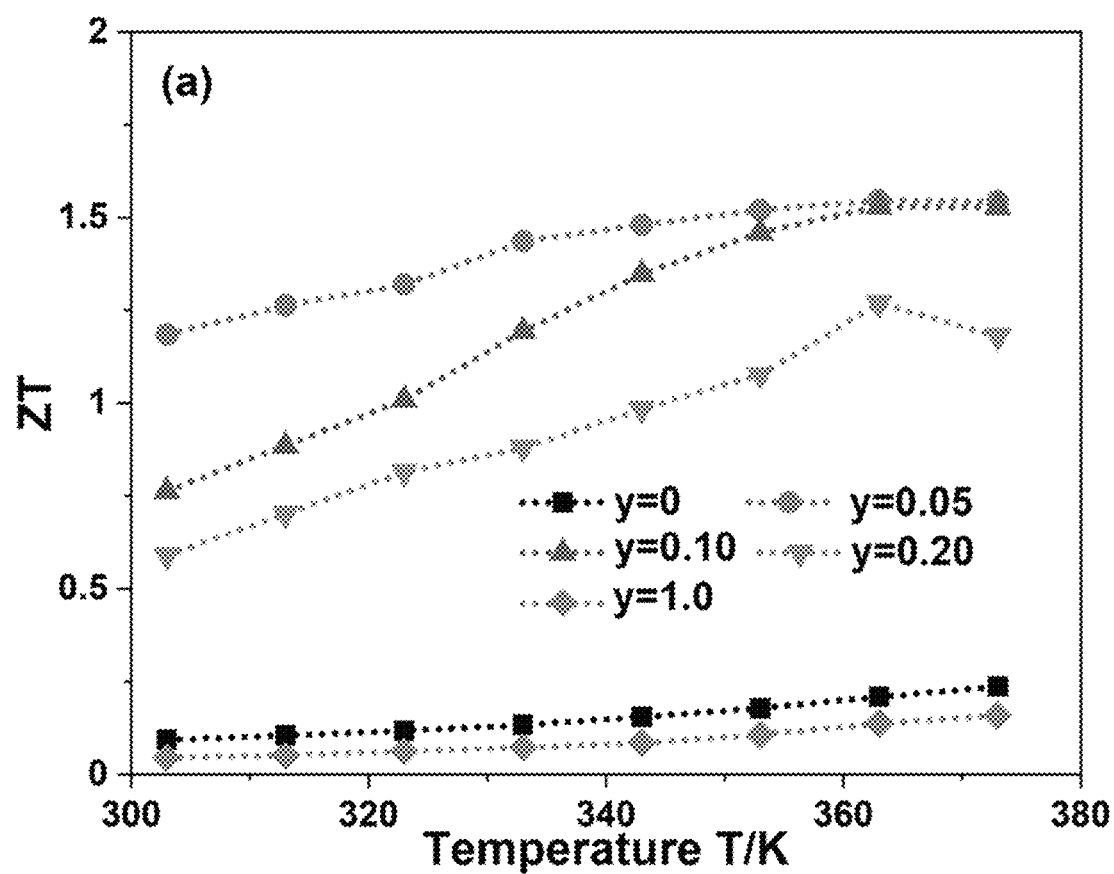

FIG. 4: Temperature-dependent figure-of-merit for the films of Example 1.

Figure 5:
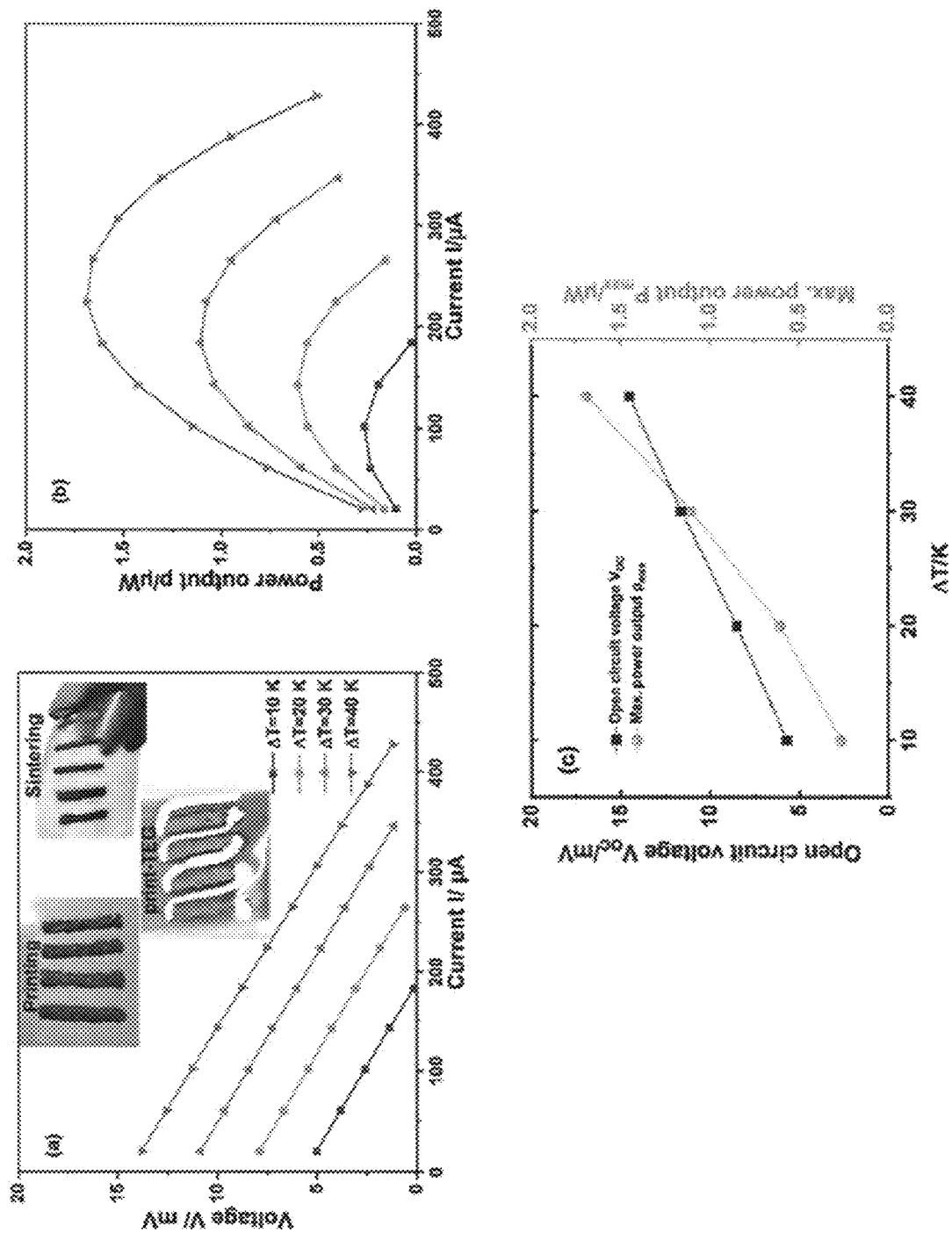

FIG. 5: (a) Variation of output voltage and (b) output power of the print-TEG with current while operating at different ΔTs. (c) ΔT dependent open-circuit voltage (Voc) and maximum power output ($P_{max}$) of the print-TEG.

Figure 6:
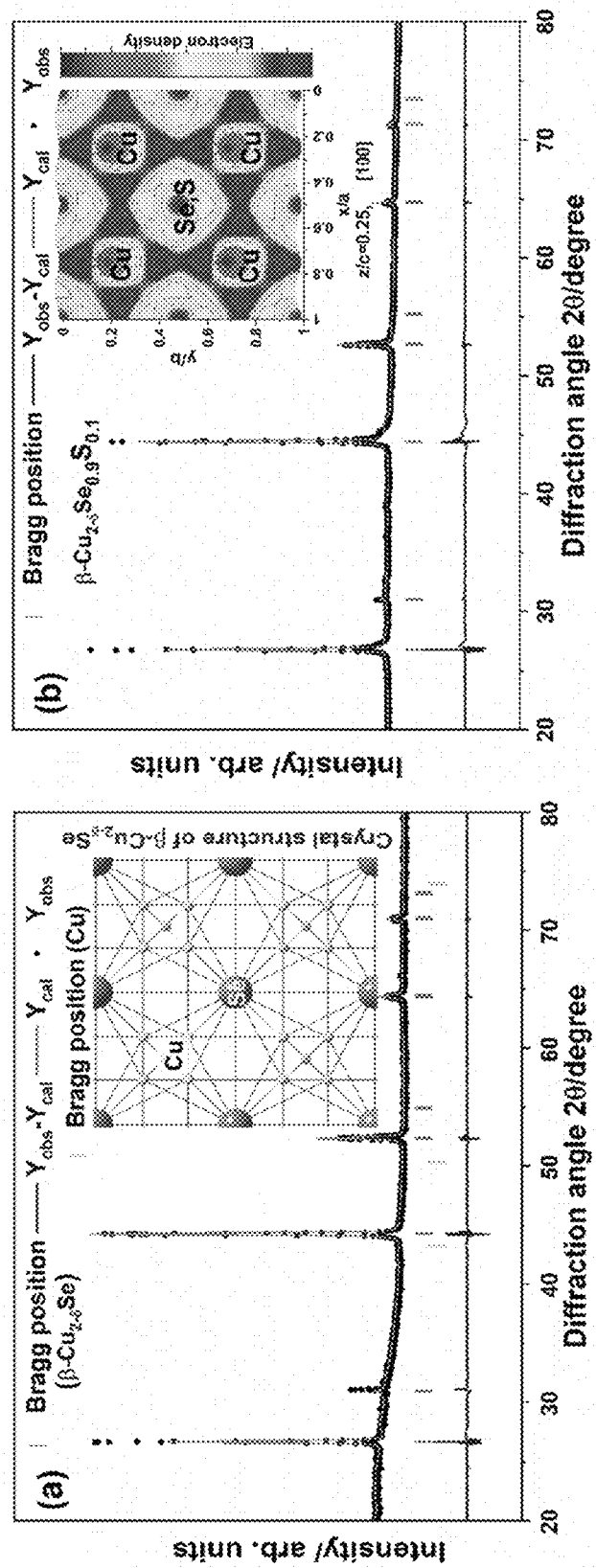

FIG. 6: XRD diffraction patterns together with Rietveld refinement results of the $Cu_2Se_{1-x}S_x$ films for x=0 (a) and x=0.1 (b) of Example 2.

Figure 7:
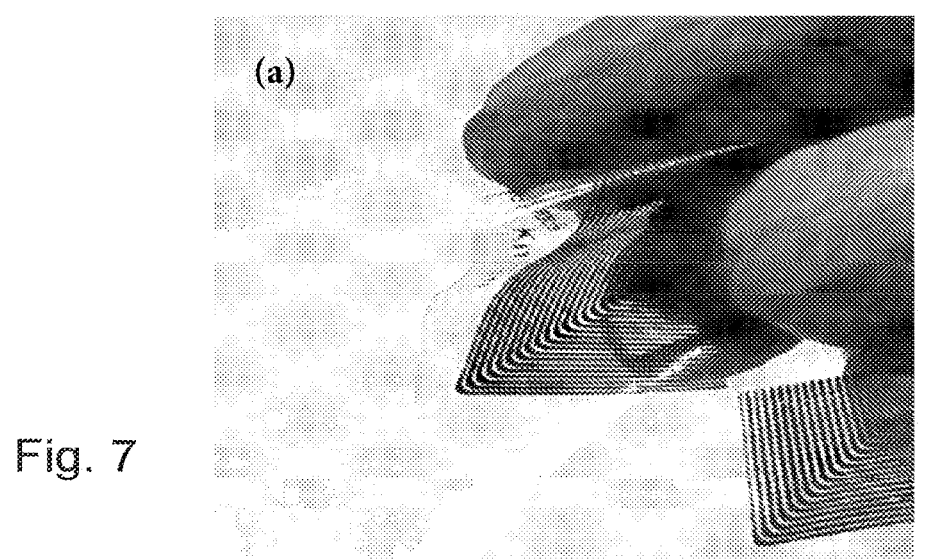
Figure 7:
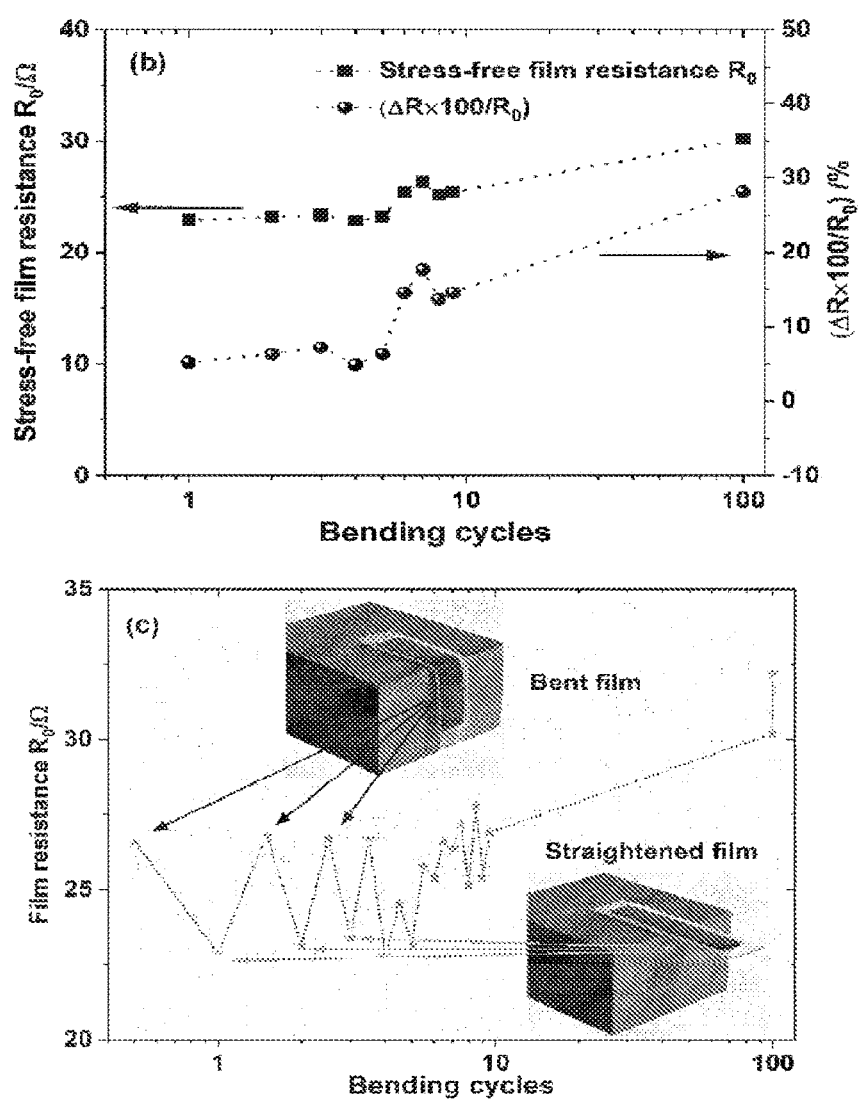

FIG. 7: (a) Screen-printed film of Example 2 twisted by fingers. (b) Stress-free film resistance $R_0$ and change in resistance of the film with bending cycles. (c) Film resistance during bent and relaxed conditions.

Figure 8:
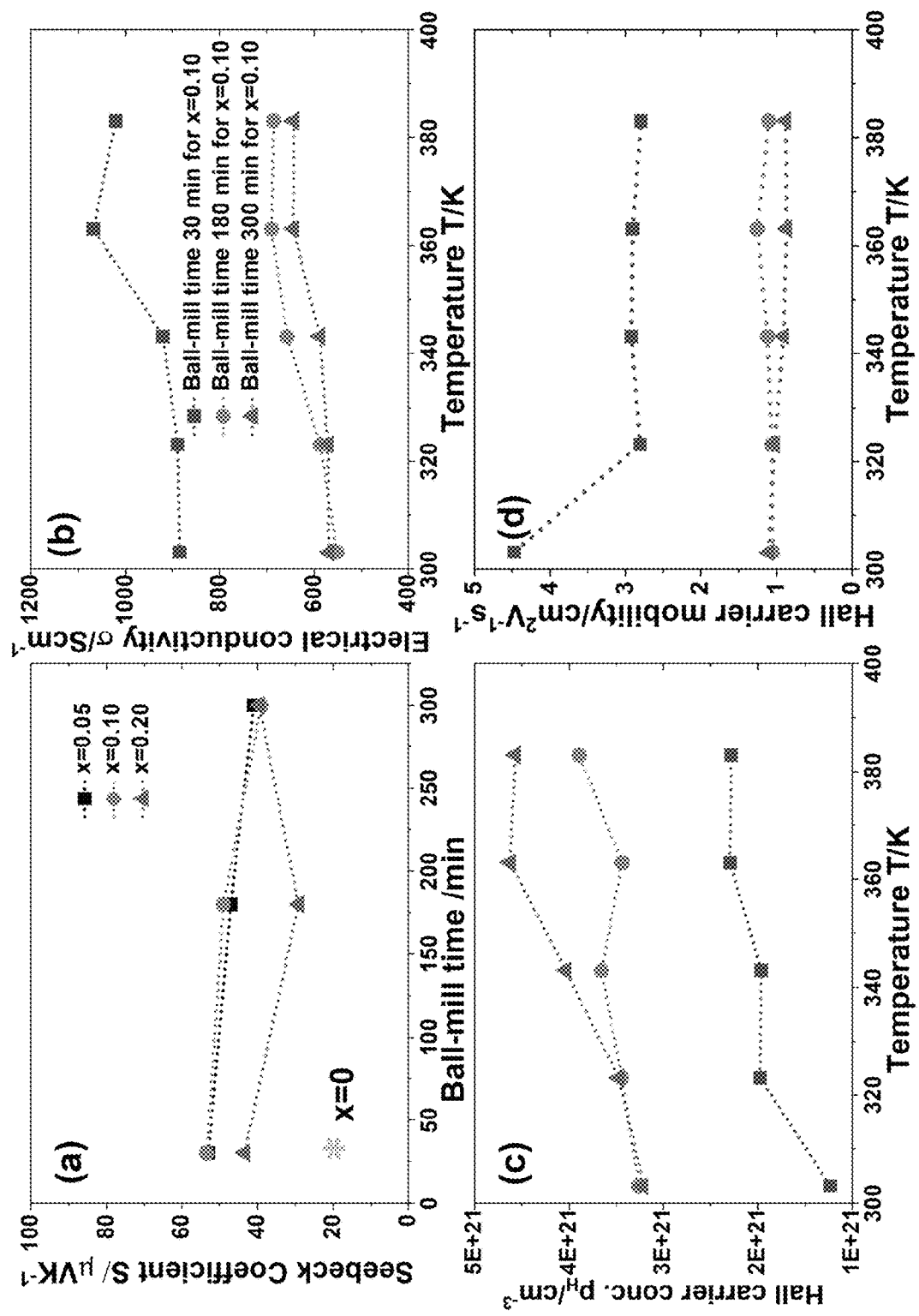

FIG. 8: (a) Variation of the Seebeck coefficient S with ball-milling time for different compositions, 0≤x≤0.20 of Example 2. Temperature-dependent transport parameters electrical conductivity σ (b), Hall carrier concentration $p_H$ (c) and Hall carrier mobility $\mu_H$ (d) of the printed film with x=0.10 for different ball-milling time.

Figure 9:
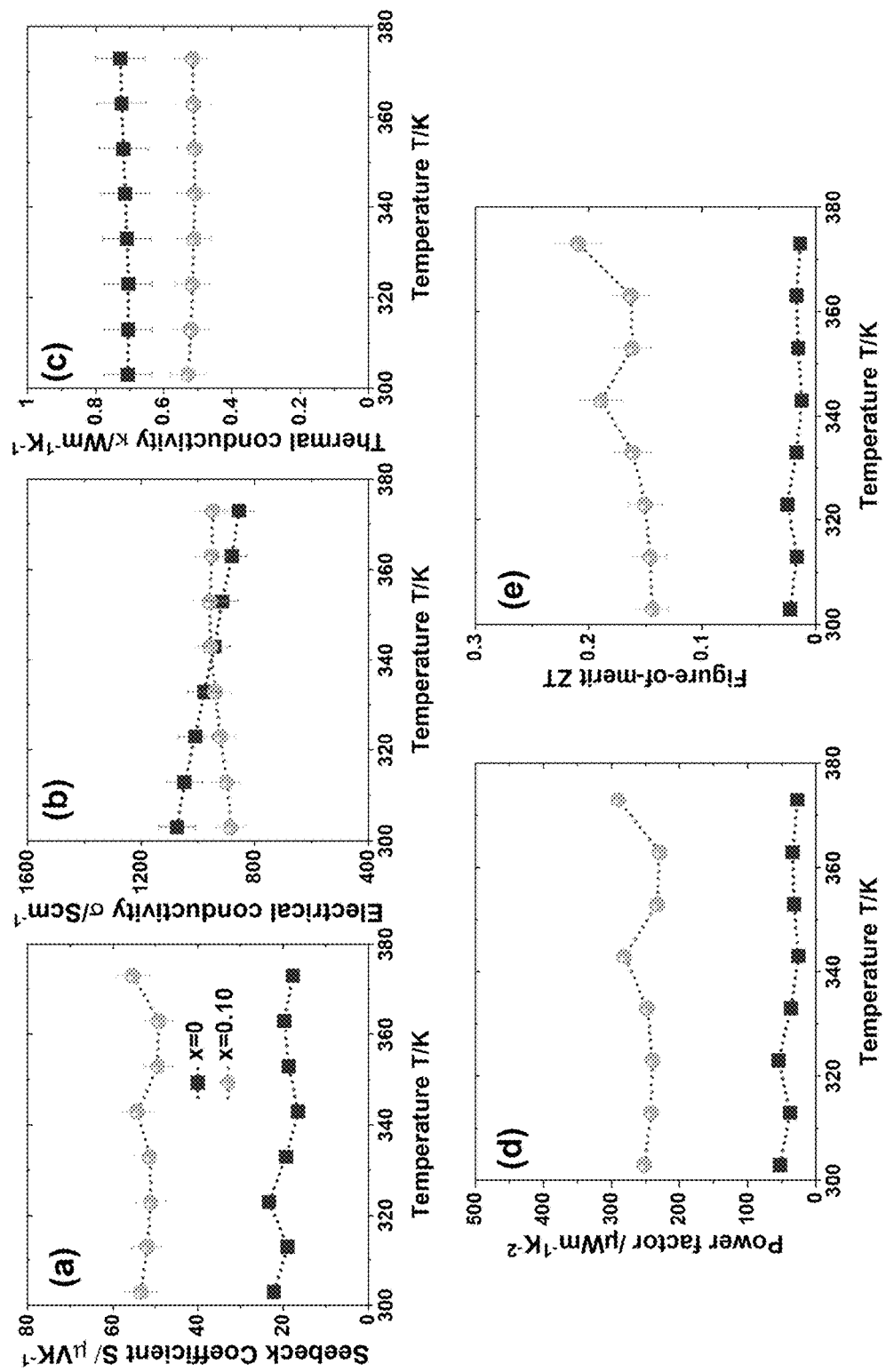

FIG. 9: Temperature-dependent TE parameters Seebeck coefficient S (a), electrical conductivity σ (b), thermal conductivity κ (c), power factor $S^2\sigma$ (d) and the figure-of-merit ZT (e) of the printed films with x=0 and 0.10 of Example 2.

Figure 10:
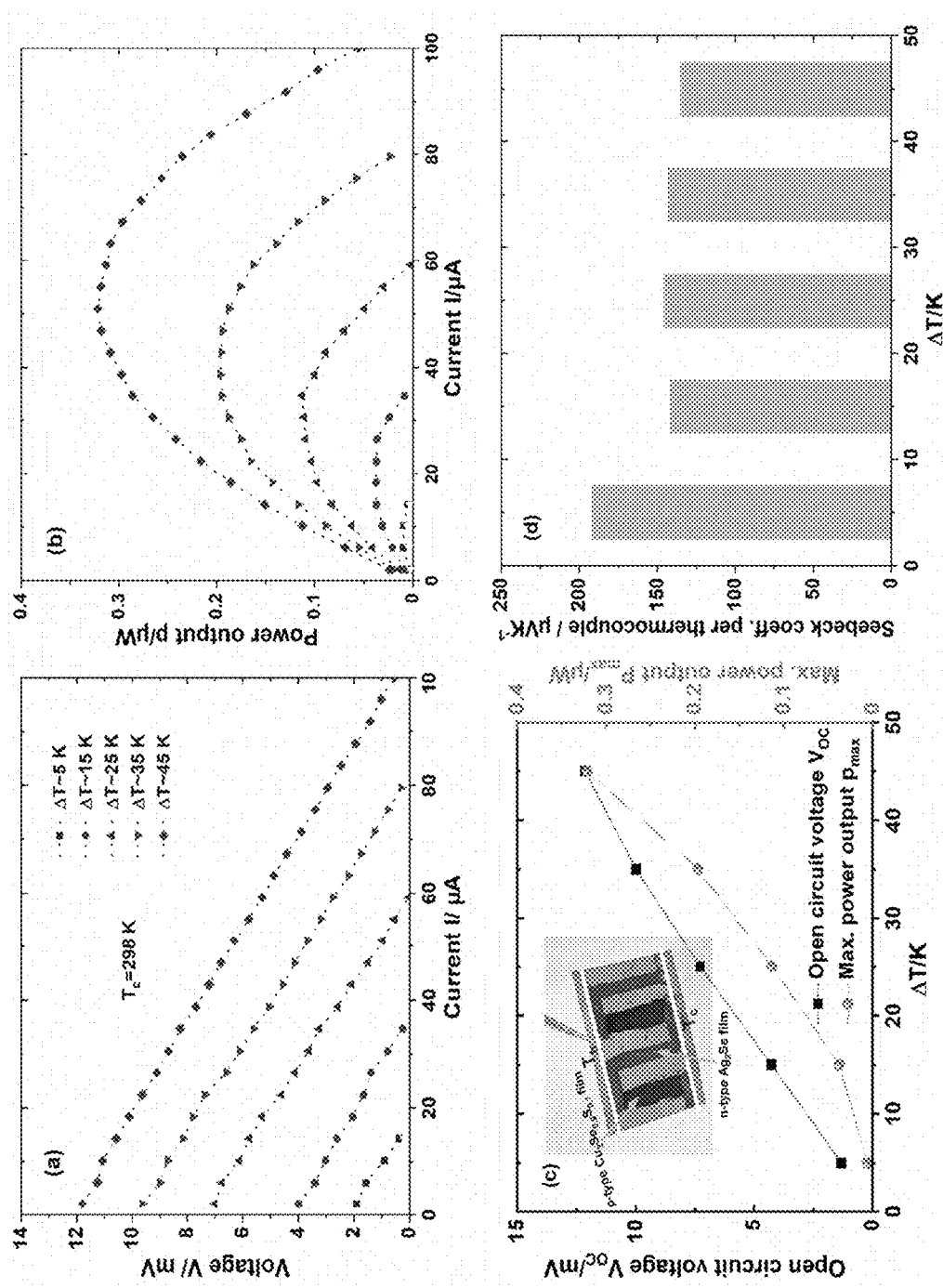

FIG. 10 (a) Variation of output voltage and (b) output power of the flex-TEG of Example 2 with current while operating at different ΔTs. (c) ΔT dependent open-circuit voltage (Voc) and maximum power output (Pmax) of the print-TEG. (d) Seebeck coefficient per thermocouple for different ΔTs.

Figure 11:
Figure 11:
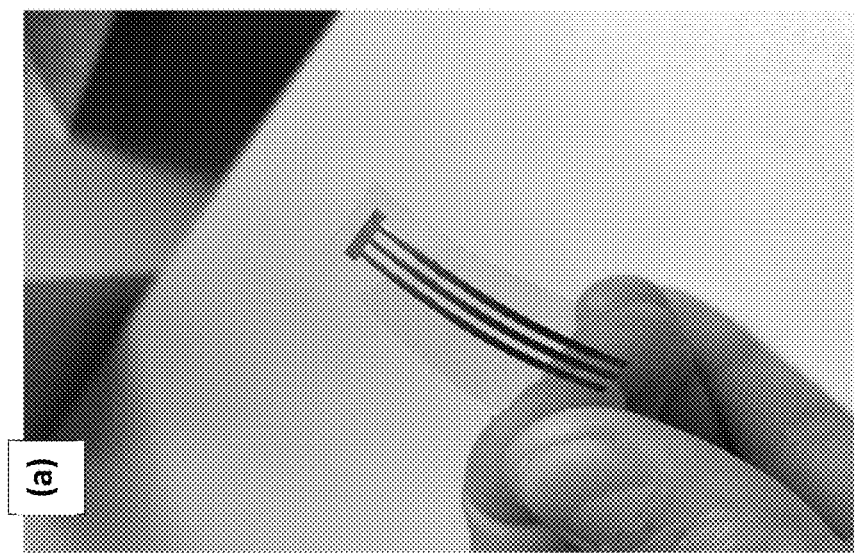

FIG. 11 Flash sintered (a) p-type $0.9(Bi_{0.5}Sb_{1.5}Te_3)-0.1$ (IB) and (b) n-type $0.9(Bi_2(SeTe)_3)-0.1(IB)$ printed film. The inks were prepared by a wet-balling process.

As mentioned above, the present invention is based on a novel strategy for producing a flexible printed thermoelectric material comprising an inorganic binder, which bridges the grains of TE materials with non-stoichiometric β-$Cu_{2-\delta}$Se through a facile printing-sintering process, thereby avoiding interruption of carrier transportation at the grain boundaries. According to the present invention, an ink composition is used for producing printable TE materials, which comprises a precursor material for a thermoelectric material, a precursor material for an inorganic binder comprising a mixture of Cu, Se and optionally S powder, an organic binder and an organic solvent. The molar ratio of the Cu powder to the total of Se and S powder combined is 2:1. Moreover, the molar ratio of the Se powder to the S powder expressed by the formula (1-x) Se:x S is in the range of 0≤x≤0.20. The amounts of the precursor material for a thermoelectric material and the precursor material for an inorganic binder are adjusted such that the weight ratio of the precursor material for a thermoelectric material to the precursor material for an inorganic binder expressed as [(1-y) thermoelectric material:y inorganic binder] is in the range of 0<y≤0.25.

That is, the S powder is not necessarily contained in the precursor material for an inorganic binder but may be contained as an optional element, wherein the molar ratio of the Se powder to the S powder expressed by the formula (1-x) Se:x S is in the range of 0≤x≤0.20. In other words, the present invention includes embodiments, wherein the precursor material for an inorganic binder consists of a mixture of Cu and Se powder, wherein the molar ratio of the Cu powder to the Se powder is 2:1.

As will be described in more detail in the examples below, it has been found that if the weight ratio of the precursor material for a thermoelectric material to the precursor material for an inorganic binder in the ink composition is within the above-mentioned range, the resulting printed TE material has an excellent power factor ($S^2\sigma$) as well as an excellent thermoelectric figure-of-merit (ZT). This is due to the fact that if the amount of the inorganic binder is in the above identified range, grains of TE materials are bridged with non-stoichiometric β-$Cu_{2-\delta}$Se, thereby avoiding interruption of carrier transportation at the grain boundaries. On the other hand, when the amount of the inorganic binder is y>0.25, percolation pathways are formed by the β-$Cu_{2-\delta}$Se phase, whereby the thermo-transport phenomena is dominated by the β-$Cu_{2-\delta}$Se phase.

In a specific embodiment, the amount of the inorganic binder is 0.05≤y≤0.10 in view of a high temperature dependent power factor Seα and high figure-of-merit ZT.

The precursor material for a thermoelectric material comprised in the ink of the present invention is not particularly limited and any inorganic p- or n-type material can be suitably adapted. Examples for suitable materials include $Bi_zSb_{2-z}Te_3$ with 0≤z≤2, n-type $Bi_2(TeSe)_3$, n-/p-type half-Heusler alloys and n-/p-type Skutterudites. In a preferred embodiment, the precursor material for a thermoelectric material is a precursor material for a p-type thermoelectric material.

Generally, the precursor material for a thermoelectric material in the ink of the present invention comprises a powder of an inorganic n-type or p-type material. The precursor material for a thermoelectric material may be a powder of a thermoelectric material or may contain powders of elements forming a thermoelectric material upon processing the ink composition according to the present invention.

In particular, when the TE material is p-type $Bi_zSb_{2-z}Te_3$ with 0≤z≤2, the precursor material for a thermoelectric material included in the ink of the present invention is a powder of Bi—Sb—Te alloy having a molar ratio of Te to the total of Bi and Sb combined of 3:2. In a preferred embodiment, the thermoelectric material is p-type $Bi_{0.5}Sb_{1.5}Te_3$ and the corresponding precursor material is a powder of Bi—Sb—Te alloy having a molar ratio of Te to Bi to Sb of 3:0.5:1.5.

As mentioned above, the inorganic binder comprised in the ink of the present invention may contain sulfur. It has surprisingly been found that the TE performance of flexible printed materials can be enhanced significantly by substituting Se with S. Moreover, as will be shown in the Examples below, the flexibility and bending characteristics of TE materials obtained by using a Cu—Se—S based material are substantially improved.

For this reason, the present invention is also directed to a Cu—Se—S-based ink composition for printable thermoelectric materials, comprising a mixture of Cu, Se and S powders, wherein the molar ratio of the Cu powder to the total of Se and S powder combined is 2:1 and wherein the molar ratio of the Se powder to the S powder expressed by the formula (1-x)Se:xS is in the range of 0<x≤0.20.

As outlined above, the ink composition according to the present invention further comprises an organic solvent and an organic binder, preferably polyvinylpyrrolidone (PVP) and may comprise at least one additive selected from siliceous or aluminous materials, preferably fumed silica and/or a liquid rheology dispersing additive, preferably BYK 430.

The organic binder is comprised in the inventive ink composition as a film-forming additive. Suitable binders are readily soluble in organic solvents and enable for instance the formation of scratch-resistant films at room temperature.

In addition, the binder should impart good stability to the dried films and ensure that there are no visible cracks on the surface.

Suitable organic binders are acrylonitrile butadiene styrene (ABS), polycarbonate (PC), polyethylene (PE), polypropylene (PP), polyvinylidene fluoride (PVDF), polyvinyl chloride (PVC), polyvinylpyrrolidone (PVP) or polystyrene based resins, or corresponding copolymers thereof. Preferably, the organic binder is polyvinylpyrrolidone (PVP).

The organic binders may have a weight average molecular weight Mw of about 10,000 to 5,000,000 g/mol, preferably of about 10,000 to 1,000,000 g/mol, more preferably of about 20,000 to 100,000 g/mol.

The organic binder is generally commercially available, and the weight average molecular weight Mw of the organic binder refers to the value specified by the manufacturer's data. In case these data are not available, the weight average molecular weight Mw of the organic binder used as a binder is determined by gel permeation chromatography (GPC) normalized to commonly used standards i.e. polystyrene or polyethylene glycol/oxide (PEG/PEO) known to the skilled person.

According to a particularly preferred embodiment of the present invention, the organic binder is polyvinylpyrrolidone (PVP) having a weight average molecular weight Mw of about 10,000 to 5,000,000 g/mol, preferably of about 10,000 to 1,000,000 g/mol, more preferably of about 20,000 to 100,000 g/mol.

Suitable organic solvents to be comprised in the ink of the present invention are organic solvents having a boiling point of at least 100° C., and in which an organic binder is soluble. Preferably, the organic solvent may be selected from the group consisting of toluene, ethylbenzene, chlorobenzene, N-methyl-2-pyrrolidone (NMP), N,N-dimethylformamide, cyclohexanol, cyclohexanone, and mixtures thereof. In a particularly preferred embodiment, the organic solvent is N-methyl-2-pyrrolidone (NMP).

The mixing ratio of the organic binder in the organic solvent is not specifically limited and merely depends on the solubility of the organic binder in the specific solvent and/or on the desired viscosity of the ink. In preferred embodiments, the weight ratio of the organic binder to the organic solvent is from 0.1:99.9 to 10:90 without being limited thereto.

Also, the mixing ratio of the powders of the precursor materials for the thermoelectric material and the inorganic binder with the solvent including the organic binder is not specifically limited. Generally, the weight ratio of the precursor materials to the total weight of the organic binder and the organic solvent is in the range of 0.01:1 to 0.5:1.

According to a preferred embodiment of the present invention, the weight ratio of the precursor material for an inorganic binder comprising Cu, Se and S powder, to the total weight of the organic binder and the organic solvent is in the range of 0.5:1 to 5:1, more preferably 1:1 to 3:1.

As mentioned above, the ink composition according to the present invention may further comprise one or more additives to control the viscosity and density of the ink, for instance. Preferably, the ink composition according to the present invention further comprises at least one additive selected from siliceous or aluminous materials and/or a liquid rheology dispersing additive. Most preferably, the ink composition comprises fumed silica and BYK 430. Of course, other additives may be comprised in the ink composition in order to adjust other properties of the resulting TE material.

The amount of the additives may range from 0.001 to 5.0 wt.-% based on the total weight of the ink composition.

Furthermore, the particle size of each of the Cu, Se and S powders comprised in the precursor material for the inorganic binder is not specifically limited and may be selected depending on the desired application of the TE material and/or commercially availability. Generally, suitable Cu, Se and S powders have a particle size of 500 μm or less. Preferably, the particle size of the Cu, Se and S powders is 150 μm or less, more preferably 10.0 μm or less, even more preferably 1.0 μm or less, and most preferably 500 nm or less.

Even though the lower limit of the particle size is not specifically restricted, the Cu, Se and S powders have preferably a particle size of at least 10 nm, more preferably of at least 100 nm, in particular for inkjet printable ink. The upper limit of the particle size of the Cu, Se and S powders refers to the maximum particle size of each powder, which is commonly specified by the manufacturer's data or to be measured by laser diffraction analysis especially for smaller particles, or by sieve analysis for bigger particles.

In case the precursor material for a thermoelectric material is also in a powder form, the particle size of the respective powders may be 150 μm or less, preferably 10.0 μm or less, more preferably 1.0 μm or less, and most preferably 500 nm or less. The lower limit of the particle size is not specifically restricted. The powder may have a particle size of at least 10 nm, more preferably of at least 100 nm, in particular for inkjet printable ink. The upper limit of the particle size refers to the maximum particle size of each powder, which is commonly specified by the manufacturer's data or to be measured by laser diffraction analysis especially for smaller particles, or by sieve analysis for bigger particles.

The ink composition according to the present invention can be prepared by conventional mixing procedures. For instance, without being limited thereto, the ink composition may be prepared by mixing the precursor material for the inorganic binder comprising a mixture of Cu, Se and S powder, the precursor material for the thermoelectric material in the specific weight ratio, the organic solvent, the organic binder and optional additives using a magnetic stirrer. Of course, other mixing devices may be employed to reduce particle size and to obtain a homogenous mixture of the aforementioned components. The mixing may be carried out at room temperature (RT), i.e. of about 20° C., or at higher temperatures. A homogenous mixture of the precursor materials is usually achieved after stirring for at least 5 min.

In a preferred embodiment, the preparation of the ink may be performed by wet ball-milling of the precursor material for a thermoelectric material and the precursor material for an inorganic binder in presence of an organic solvent and an organic binder. It has surprisingly been found that printed thermoelectric materials that have been prepared from ink that has been subjected to wet ball-milling shows significantly improved flexibility.

Thereafter, in order to produce a flexible printed TE material, the ink composition is printed onto a substrate to preferably form a film of the ink composition. Subsequently, according to the present invention, the ink composition, which is preferably in the form of a film, is sintered at a temperature of 200° C. to 500° C. for at least 60 seconds.

In order to provide the printed film, any method known in the art may be employed capable to coat the ink composition onto a substrate. Preferably, screen printing, doctor blading, airbrushing or inkjet printing methods are applied to form the printed film. These methods usually provide a two-dimensional (2D) layer of the ink composition. However, the present invention is not limited to 2D films, but the ink composition may also be used in three-dimensional (3D) printing techniques.

The substrate is not specifically limited and commonly used substrates such as a glass substrate, or substrates for flexible integrated circuits may be used. However, preferably, the substrate is flexible and thin polyethylene naphthalate (PEN) or polyethylene terephthalate (PET) films are most preferred.

After printing the ink composition onto the substrate, the printed ink composition, which is preferably in the form of a film, is sintered at a temperature of 200° C. to 500° C. in order for the precursor materials of the inorganic binder to react and to form the desired thermoelectric material/inorganic binder composite material. The elemental Cu, Se and S start to react at a temperature of approximately 200° C. and the $Cu_2(S_xSe_{1-x})$ phase is found to be formed at approximately 350° C. through thermally stimulated dissociative adsorption of Se and S by Cu.

According to the present invention, the sintering time is not specifically limited and depends on the sintering temperature. In general, it has been found that higher sintering temperatures and shorter sintering time lead to higher TE performance. The step of sintering is carried out for at least 60 seconds. The upper limit of the sintering time is preferably 20 min or less.

Sintering may be carried out either under vacuum or an inert atmosphere, such as Ar, $N_2$ etc. Further, sintering may be carried out once or it can be carried out multiple times.

According to the present invention, the films of the ink composition may also be covered during sintering with e.g. a printable methylcellulose solution or any other suitable polymeric solution in order to lower oxidation.

In a particular embodiment, the method for producing a flexible printed thermoelectric material, comprises the steps of providing an ink composition by wet ball-milling the precursor material for a TE material, the precursor material for an inorganic binder comprising Cu and Se powder, the organic solvent and the organic binder; printing the ink composition onto a flexible substrate; sintering the ink composition by photonic flash sintering; and pressing the printed TE material. In this particular embodiment, the TE material is preferably $Bi_{0.5}Sb_{1.5}Te_3$ and the precursor for the TE material therefore contains a powder of Bi—Sb—Te alloy having a molar ratio of Te to Bi to Sb of 3:0.5:1.5. With this particular production method a flexible printed thermoelectric material can further improve the flexibility of the obtained printed TE material. However, it should be noted that the pressing step is not necessarily contained in the production method of the present invention and flexible printed TE materials with good properties can be obtained also without the optional pressing step. Exemplary photonic flash sintering (pulse) conditions using a FulseForge photonic curing system (NOVACENTRIX) are as follows:

Bank voltage: 320 V,
Envelope: 5000 µs
µPulses: 35
Duty cycle: 50%
Estimated temperature reached: 400-500° C.

However, the parameters can be suitably changed and adapted depending on the materials and substrates used.

As mentioned above, the resulting flexible printed TE material obtainable by the method according to the present invention comprises a non-stoichiometric $\beta$-$Cu_{2-\delta}S_xSe_{1-x}$ phase with $0 \leq x \leq 0.20$ and $0 \leq \delta \leq 0.15$. In a preferred embodiment, the off-stoichiometry is $0.02 \leq \delta \leq 0.10$, more preferably $0.03 \leq \delta \leq 0.10$. Depending on the composition of the precursor material for the inorganic binder comprised in the ink of the present invention, sulfur might be contained in the $\beta$-$Cu_{2-\delta}S_xSe_{1-x}$ phase. This phase bridges the grains of TE materials and therefore, unlike conventional inorganic powder based printed films containing grain boundaries, interruption of carrier transportation at the grain boundaries due to binders and additives is minimized, which results in high advantageous electrical conductivity $\sigma$, and thus in an improved TE performance.

Thus, the present invention provides high performance printed TE materials having very high Seebeck coefficients (S) of e.g. more than 200 $\mu VK^{-1}$ with an excellent TE power factor of even more than 1500 $\mu Wm^{-1}K^{-2}$ at room temperature. In addition, very high figure-of-merit of more than 1.5 has been realized as will be described in more detail in the examples below.

According to the present invention, it is possible to provide a flexible printed TE material in the micrometer scale. According to a preferred embodiment, the thickness of the flexible printed TE material is in the range of 10 to 250 µm.

Using the TE material according to the present invention for p-type legs, a flexible printed TE generator can be provided. Thus, the present invention further relates to a flexible printed thermoelectric generator (print-TEG) comprising the flexible printed thermoelectric material as p-type legs. In particular, the print-TEG according to the present invention may comprise several to more than 1000 thermocouples using the flexible printed TE material as p-type legs.

According to a preferred embodiment, the print-TEG comprises n-type legs made from a n-type $Bi_2(TeSe)_3$ based thermoelectric ink or an Ag—Se-based ink composition for n-type printable thermoelectric materials. Such an Ag—Se-based ink composition is described in EP 19 198 306.3. The flexible printed TE material according to the present invention can be employed for commercial applications for high power density flexible print-TEG due to its high TE performance, reproducibility and stability. The flexible print-TEGs can have manifold applications in waste heat recovery devices for industrial applications, geothermal energy, vehicles, body heat harvester and energy harvesting for autonomous sensor systems such as heat-flux sensors. Apart from waste heat recovery applications, the flexible printed devices can be used for cooling applications. In particular, the print-TEGs according to the present invention can be integrated with wearable materials, such as helmets or clothes, in order to maintain or lower a body temperature.

The present invention will be further illustrated in the following examples without being limited thereto.

EXAMPLES

Materials

The following materials were used in the following examples. Ingots of p-type BST ($Bi_{0.5}Sb_{1.5}Te_3$) (beads, 99.99% trace metals basis, Sigma-Aldrich), Copper powder (spheroidal) (10-25 µm, 98%, Sigma-Aldrich), Se powder (100 mesh, >99.5% trace metals basis, Sigma Aldrich), sulfur powder (Sigma-Aldrich), N-Methyl-2-pyrrolidone (NMP) (anhydrous, 99.5%, Sigma-Aldrich), Polyvinylpyrrolidone (PVP) (average Mw—40000, Sigma Aldrich), fumed silica (Evonik), Polyethylene naphthalate (PEN) and Kapton substrate.

Characterization Methods

Crystallographic and phase analysis of the printed films were performed by X-ray diffraction technique using the Cu-Kα radiation on a BRUKER D8 diffractometer equipped with a Lynxeye XE detector and an Anton Paar HTK1200 heating chamber in Bragg-Brentano geometry. Morphological and microstructural analysis was done by secondary electron microscopy (SEM, FEI XL30S, PHILIPS). Elemental analysis was performed using electron probe microanalyzer (EPMA, JOEL). The thickness of the printed films was determined by BRUKER 3D Microscopes based on white light interferometer (WLI). The room temperature (RT) transport parameters of the films on glass substrates were determined using a Hall measurement setup (Linseis HCS 10). Temperature-dependent transport parameters, electrical conductivity ($\sigma$), Hall coefficient ($R_H$), Hall mobility ($\mu_H$), carrier concentration ($f_H$), and type of charge carriers were determined using the Hall measurement technique (Linseis HCS 10). Temperature-dependent bulk thermal conductivity ($\kappa$) of a 10 mm disc made of (1-y) BST-(y) inorganic binder inks by cold pressing at 50 MPa pressure, followed by sintering at 703 K in vacuum for 10 min was determined using Netzsch LFA-427. The Seebeck coefficient S at RT and temperature-dependent Seebeck coefficient S in the temperature range from 300 to 373 K of the printed films were measured using a custom-built setup with an experimental measurement error of about 10%. The Seebeck measurement setup uses two temperature-controlled copper blocks in close proximity, which generate a temperature difference. The sample is placed across the two blocks and the temperature is measured on each side of the sample with two temperature sensors being pressed onto the sample. The Seebeck-voltage is measured between these two tips to ensure the thermal and the electrical measurement happens at the same position on the sample. The thermal conductivity ($\kappa$) of a printed film was determined using a Linseis thin film analysis (TFA) system.

Example 1: High Room Temperature Figure-of-Merit p-Type $Bi_{0.5}Sb_{1.5}Te_3$ (BST) Based Printable TE Material with Non-Stoichiometric $\beta$-$Cu_{2-\delta}Se$ Based Inorganic Binder (IB)

At first, in order to prepare the Cu—Se based inorganic binder, the powder elements (Cu and Se) were weighed in stoichiometric ratio. The powders were then mixed with an organic solvent-PVP solution (organic solvent NMP:binder (PVP)=93:7) and fumed silica in a 60:40:0.5 ratio. The obtained mixture was stirred for 12 hours at 1000 rpm. The p-type $Bi_{0.5}Sb_{1.5}Te_3$ (BST) was ground to a powder of less than 100 µm dimension by mortar and pestle for 20 minutes. The resulting powder was mixed with the Cu—Se-based inorganic binder (IB) in different ratios, (1-y)BST:(y)IB with y=0 to 100 in order to optimize their performance by characterizing their morphological and physical properties. Then, an additional 20 wt % of the organic solvent-PVP solution is added to the mixture. The final mixture was then stirred for 2 hours at 1000 rpm at room temperature.

The prepared inks were painted/printed on different substrates (glass and Kapton) using the doctor blading technique. Finally, the printed films having a thickness of about 150-200 µm were sintered at 703 K in a vacuum oven for 10 minutes and taken out after they cooled down to below 350 K.

Crystallographic and Microstructure Analysis

The crystallographic structures of the printed films (1-y) BST-(y)IB for y=0, y=0.10 and y=1 sintered at 703 K were obtained by XRD analysis at room temperature (cf. FIG. 1). The XRD pattern of the film with y=0 corresponds to that of pristine p-type $Bi_{0.5}Sb_{1.5}Te_3$ material. The XRD pattern of the film with y=0.05 indicates the formation of $\beta$-$Cu_{2-\delta}Se$ phase along with the main p-type $Bi_{0.5}Sb_{1.5}Te_3$ phase. The RT XRD pattern of the pure inorganic binder film (y=1) indicates that the non-stoichiometric cubic $\beta$-$Cu_{2-\delta}Se$ phase is prominent together with a small amount of excess Cu. However, the amount of excess Cu is found to be insignificant (<1 vol. %).

In order to determine the $Cu_2Se$ phase formation temperature, temperature-dependent XRD analysis of the printed film with y=1 was performed from 298 to 673 K (cf. FIG. 1d). At room temperature, the film with y=1 is found to be a mixture of unreacted Cu and Se. The elemental Cu and Se are starting to react at a temperature above 473 K and the $Cu_2Se$ phase is found to be formed at 623 K through thermally stimulated dissociative adsorption of Se by Cu.

As a result, in the printed films for 0<y≤0.20, the BST TE grains are connected by the highly electrical conductive $Cu_2Se$ phase, thereby minimizing the interfacial resistance at the grain boundaries. To extract the in-detail crystallographic structure of the $Cu_2Se$ phase at room temperature, Rietveld refinement of the XRD pattern of the film with y=1 was performed using the FULLPROF program. The crystallographic structure with refinement results is shown in FIG. 1 (b).

The Rietveld refinement analysis indicates that the film with y=1 corresponds to a primary non-stoichiometric cubic $\beta$-$Cu_{2-\delta}Se$ phase belonging to space group F m –3 m with less than 1 vol. % of excess Cu. The non-stoichiometry '$\delta$' is found to be in the range of 0.03 to 0.04. Generally, $Cu_2Se$ is found to be the $\alpha$-$Cu_2Se$ phase with a complex structure at room temperature, but non-stoichiometry can lead to the formation of cubic $\beta$-$Cu_{2-\delta}Se$ phase.

It is known that a non-stoichiometry of $\delta$=0.03 can cause a structural phase transition to the cubic $\beta$-$Cu_2Se$ phase. Hence, in the present example, the cubic $\beta$-$Cu_2Se$ phase is formed due to the observed non-stoichiometry $\delta$ in $Cu_2Se$. The lattice parameter of the $\beta$-$Cu_{2-\delta}Se$ phase unit cell is calculated to be a=0.576(2) nm. The Se atoms in the $\beta$-$Cu_{2-\delta}Se$ crystal lattice are found to occupy Wyckoff position 4a (0, 0, 0) in a face-centered cubic arrangement and disordered Cu atoms are located in two different Wyckoff positions 8c (¼, ¼, ¼) and 32f (x, x, x).

Fourier maps for electron density distributions inside a unit cell of $\beta$-$Cu_{2-\delta}Se$ at the planes z/c=0, z/c=0.25, and z/c=0.5 along the direction [001] are shown in FIG. 1(c). It can be seen that the electron density distributions of the Se atoms at the z/c=0 plane are concentrated at the corners and center 4a (0, 0, 0) position. Similarly, from the Fourier maps of the electron density distribution of atoms at z/c=0.25 and z/c=0.5 planes, the position of the Cu and Se atoms can be located at positions 8c (¼, ¼, ¼) and 4a (0, 0, 0). Morphology of the printed film with y=0.10 sintered at 703 K is analyzed using a white light interferometer and is found to be homogeneous.

Thermoelectric Performance of Printed Films

The composition-dependent Seebeck coefficient of the printed films with varying Cu—Se-based inorganic binder IB content sintered at 623 K and 703 K was studied to identify the optimized composition and sintering temperature (cf. FIG. 2 (a)). It is found that the films containing <20 wt % IB exhibit a Seebeck coefficient S of more than 100

μVK$^{-1}$ with reasonably high electrical conductivity except for the pristine compound. A low Seebeck coefficient S for films with more than 20 wt % of IB indicates the formation of the percolation path of the Cu$_2$Se phase.

Hence, temperature dependent in-detail thermo-transport properties of the printed films with less than 20 wt % of inorganic binder IB and of the film with 100 wt % of IB on glass substrates were studied in the temperature range from 300 K to 400 K. The variation of Hall carrier concentration ($\eta_H$) and Hall carrier mobility ($\mu_H$) with temperature calculated from the Hall coefficient ($R_H$) is shown in FIGS. 2 (c) and (d). The room temperature transport parameters of the printed films are given in Table 1. The $\eta_H$ increases with increasing content of the inorganic binder in the films due to the increase of the amount of Cu$_2$Se phase formed and its respective higher carrier concentration. $\eta_H$ is found to be in the range of $2 \times 10^{19}$ cm$^{-3}$ to $5 \times 10^{20}$ cm$^{-3}$.

TABLE 1

The RT transport parameters, Hall carrier mobility ($\mu_H$) and charge carrier concentration ($p_H$) are determined by measuring the Hall coefficient of printed films.

| Films | Electrical conductivity σ, Scm$^{-1}$ | Hall mobility $\mu_H$, cm$^2$/V-s | Hall Carrier Concentration $p_H$, $\times 10^{19}$ cm$^{-3}$ | Hall coefficient $R_H$, cm$^3$/C |
|---|---|---|---|---|
| y = 0 | 21 | 7.86 | 1.67 | 0.373 |
| y = 0.05 | 447 | 46.7 | 5.98 | 0.104 |
| y = 0.10 | 524 | 32.4 | 10.11 | 0.062 |
| y = 0.20 | 617 | 20.7 | 18.63 | 0.033 |
| y = 1.0 | 1068 | 14.7 | 45.4 | 0.014 |

The variation of $\eta_H$ with temperature is found to be insignificant for all films except the film with y=1. Most probably, the Cu-ions become more disordered, thereby enhancing ionic conductivity in the film with y=1 and increasing overall carrier concentration at higher temperatures. On the other hand, the $\mu_H$ is initially increased to about 47 cm$^2$V$^{-1}$s$^{-1}$ for y=0.05 and decreases with increasing content of inorganic binder IB. For all films except for y=0, the $\mu_H$ decreases with increasing temperature due to the creation of disordered Cu-ions which is consistent with the temperature-dependent $\eta_H$.

The temperature-dependent TE parameters in the range from 300 K to 400 K of the films (1-y)BST-(y)IB for y=0, y=0.10 and y=1, is shown in FIG. 3. The sign of the Seebeck coefficient value S is found to be positive for all the films indicating majority charge carriers are p-type and the pristine film for y=0 shows the highest Seebeck coefficient value S over the whole temperature range with a maximum value of about 240 μVK$^{-1}$ at room temperature. The Seebeck coefficient S increases with increasing temperature and reaches a maximum value at about 360 K for all the BST based films (cf. FIG. 3 (a)).

The pristine film with y=0 shows a semiconducting behavior. However, the electrical conductivity σ is found to be higher than 400 Scm$^{-1}$ for a printed inorganic film at room temperature and decreases with increasing temperature for the films containing the inorganic binder IB due to a decrease in carrier mobility (cf. FIG. 3 (b)). The metallic behavior of the films indicates that the charge transport of all the films containing the inorganic binder is dominated by the highly conducting β-Cu$_2$Se phase, even below the percolation threshold. The thermal conductivity κ for all the films decreases slightly with increasing temperature and is estimated to be lower compared to that of their bulk values. The low K value is mainly due to the low density of the films (<60% of theoretical density) and the reduced heat transfer in the presence of remnant organic binders and additives. The lowest K of about 0.30 Wm$^{-1}$K$^{-1}$ is found for y=0 and increases with increasing content of inorganic binder at RT reaching a maximum value of about 0.65 Wm$^{-1}$K$^{-1}$ for the sample with y=1 (cf. FIG. 3 (c)). The lattice contribution to the thermal conductivity κ is dominant for the y=0 film with a negligible contribution from electron transport. The dominance of the electronic contribution to the thermal conductivity κ is found to be increased with increasing content of the inorganic binder in the composition increasing the total thermal conductivity. The temperature-dependent power factor, S$^2$σ for all the films, calculated using S and σ, is shown in FIG. 3 (d). The highest power factor value of about 18 μWcm$^{-1}$K$^{-2}$ at room temperature is found for y=0.05 and a maximum value of about 20 μWcm$^{-1}$K$^{-2}$ is reached at 360 K for y=0.10.

However, it is realized that the composition with a content of the inorganic binder between 5 and 10 wt % could show an improved power factor. The temperature-dependent figure-of-merit ZT is estimated from the power factor and thermal conductivity values for all the films (cf. FIG. 4). The ZT is found to increase with increasing temperature for all the films. The film with y=0.05 exhibits a high ZT of about 1.2 at room temperature which increases with increasing temperature. A maximum ZT of more than 1.5 is achieved by the films for y=0.05 and y=0.10 at a temperature of T>350 K, which represents a very high value for a pressure-treatment free printed TE film.

Performance of Printed Thermoelectric Generator (Print-TEG)

First, 4 films with dimensions of about 4 cm×0.5 cm are printed on Kapton substrates using the prepared printable ink containing 10 wt % of the inorganic binder IB to fabricate the p-type legs of a print-TEG. The Kapton substrate was rubbed using emery paper to roughen the surface for better adhesion of the films. Subsequently, the films were sintered at 703 K for 10 minutes. The films were connected electrically in series and thermally in parallel by silver ink to fabricate a TE generator (print-TEG). The print-TEG was characterized by the maximum power point tracking method varying the device current from 0 to 500 μA and the temperature difference ΔT from 10 to 40 K. The output voltage of the print-TEG was measured by a KEITHLEY Source measuring Unit 2601B. Hereby one side of the print-TEG was thermally coupled to the hot unit of a measuring setup and the other side of the device was exposed to the normal environment. The performance of the print-TEG with varying current is shown in FIG. 5. An open-circuit voltage of 14 mV and a maximum power output of 1.7 μW is achieved for ΔT=40 K in the print-TEG.

Example 2: Flexible Cu₂Se-Based Inorganic Printed Thermoelectric Films for Large-Area Device Applications Synthesis of TE Inks and Films:

The S doped $Cu_2Se_{1-x}S_x$ based printable TE materials were prepared for $0 \leq x \leq 0.2$ using ball milling. At first, the powder elements Cu, Se and S are weighed in stoichiometric ratio. The elements were then mixed with 30 wt % of an organic solvent containing PVP as an organic binder and NMP as solvent in a ratio of 6:94. The mixture was placed in a zirconia jar with a volume of 120 ml with 10 mm sized zirconia balls. The weight ratio of the balls to the mixture was 10:1. Then the mixture was milled using a wet milling process by using a Fritsch Planetary Mill PULVERISETTE 5 premium line. The different compositions were milled at 200 rpm for different milling time from 10 min to 300 min. The obtained inks were printed on substrates, and sintered at 623 K in a vacuum oven for 10 min. The sintered films were taken out of the vacuum oven after cooling down below 373 K.

Structural, Morphological and Mechanical Characterization

The structural and phase analysis of the $Cu_2Se_{1-x}S_x$ films was carried out at room temperature using XRD after sintering (cf. FIGS. 6(a) and 6(b)). The XRD patterns of the printed films sintered at 623 K for x=0 and x=0.10 indicate the formation of the cubic $\beta$-$Cu_{2-\delta}$Se phase at RT. A small fraction of unreacted Cu is also found to be present in the films. To analyze the crystallographic structure of $Cu_2Se$ phase and its changes due to S substitution, Rietveld refinement of the XRD patterns at RT of the films for x=0 and x=0.10 was done using the FULLPROF program. The Rietveld refinement of XRD pattern of the pristine $Cu_2Se$ film indicates a main non-stoichiometric cubic $\beta$-$Cu_{2-\delta}$Se phase belonging to $Fm\bar{3}m$ space group with approximately 1 vol. % of unreacted Cu. The $\alpha$-$Cu_2Se$ phase with a complex structure is the commonly known phase at room temperature. However, the non-stoichiometry in the $Cu_2Se$ phase causes the formation of the cubic $\beta$-$Cu_2Se$ phase. The non-stoichiometry '$\delta$' is estimated to be in the range 0.04-0.1 for x=0 and 0.1, which leads to the formation of the cubic $\beta$-$Cu_2Se$ phase. The lattice parameters for both the $\beta$-$Cu_2Se$ phase films with x=0 and x=0.10 are found to be similar and ranging between a=0.57(6) nm to 0.57(8) nm. The Cu atoms in the $\beta$-$Cu_{2-\delta}Se_{1-x}S_x$ crystal lattice are located in two distinct Wyckoff positions 8c (¼, ¼, ¼) and 32f (x, x, x). In addition, the (Se, S) atoms occupy the Wyckoff position 4a (0, 0, 0) in a face-centred cubic arrangement. The positions of (Se, S) and Cu atoms can be visualized at 4a (0, 0, 0) and 8c (¼, ¼, ¼) in the Fourier map for electron density distributions inside a cubic unit cell of 1-$Cu_{2-\delta}Se_{0.9}S_{0.1}$ at the plane z/c=0.25 along the direction [001] (cf inset of FIG. 6 (b)).

To check the mechanical flexibility of the film $Cu_2Se_{1-x}S_x$ with x=0.10, the change in resistance ($R_0$) was studied while bending the film multiple times (cf. FIGS. 7(b) and (c)). No significant change in the internal resistance ($\Delta R \times 100/R_0$) was found even after the film was repeatedly bent upto 90°. The film resistance increases from 24Ω to 35Ω after 100 bending cycles and the $\Delta R \times 100/R_0$ is found to be <30% after 100 bending cycles (cf. FIG. 7 (b)). The film resistance with bending cycles under bending and straightening conditions is shown in FIG. 7 (c).

The Seebeck coefficient of the pristine printed film with x=0 is found to be low at about 20 µVK⁻¹ at room temperature. By substituting Se with isoelectronic S up to 20 atomic %, the Seebeck coefficient can be increased by a factor of two to more than 40 µVK⁻¹, while at the same time decreasing carrier concentration value from of the order of $10^{22}$ cm⁻³ for pristine to $10^{21}$ cm⁻³ for S doped films.

The 4p-states of the Se atom and the 3p-states of the S atoms are at similar energy states, which leads to band convergence. Consequently, the effective mass is increased and the carrier mobility is decreased which causes enhancement in Seebeck coefficient value. The carrier mobility is found to be decreased from about 7 cm²V⁻¹s⁻¹ for x=0 to less than 5 cm²V⁻¹s⁻¹ for the films with x>0.

The Seebeck coefficient of the material is impacted by the ball-milling performed during the preparation of the ink. Few changes are observed when the doping is below 10%. The Seebeck coefficient starts to decrease with the milling time from an optimum value of 55 µVK⁻¹ after 30 rains of milling to 40 µVK⁻¹ if milled for 5 hours. But the trend changes with increased doping. With 20% S, after the initial decay of the Seebeck coefficient with milling time, it starts to rise up again if milled further. However, the maximum value of the Seebeck coefficient can be achieved after 30 minutes of ball milling and with a doping level below 10%.

By Hall measurement it was found that the electrical conductivity changes in proportion with temperature. This is due to the fact that with increasing temperature the number of charge carriers available to flow through the compound also increases. Analysing the ink with 10% doping and milled for 30 minutes, it is found that there is a noteworthy increment of 22% in electrical conductivity when the temperature is raised from 298 K to 363 K, as shown in FIG. 8 (b). As S doped $Cu_2Se$ demonstrates the properties of a semiconductor with temperature the carrier concentration should be increased. From FIG. 8 (c) it is apparent that the Hall carrier concentration follows the expected pattern. On the other hand the increased energy of the charge carriers at a higher temperature leads to increased number of collisions, causing a decrease in carrier mobility. Although for the studied sample of $Cu_2Se$, shown in FIG. 8 (d) very little change in carrier mobility is observed.

The temperature dependent TE performance of the pristine printed $Cu_2Se$ and 10 at. % S doped $Cu_2Se$ is shown in FIG. 9. The Seebeck coefficient is not strongly influenced by the temperature. From a range of 300K to 375K hardly any significant change of Seebeck coefficient can be noticed. The electrical conductivity for pure $Cu_2Se$ changes inversely with the temperature but the opposite can be seen when it is doped with S (cf. FIG. 9 (b)). FIG. 9(c) shows that thermal conductivity has a minimum incremental change with increasing temperature. As a whole, stable thermoelectric properties with very little deviation are observed when the temperature is manipulated. As a result the power factor and the ZT value also remain almost unchanged in the investigated temperature range, as shown in FIGS. 9 (d) and 9 (e). A power factor value of 250 µWcm⁻¹K⁻² with a ZT value of 0.15 is achieved at room temperature. The Figure-of-merit ZT is found to be increased to 0.21 at 375 K.

Referring to FIG. 10, the performance of a 4 leg TE device (flex-TEG) has been measured where printed S doped $Cu_2Se$ is used as p-type legs and printed $Ag_2Se$ is used as n-type material. The V-I curve shown in FIG. 10 (a) suggests a steady linear relationship. The maximum power of 0.35 µW is achieved at a temperature difference of 45K between the hot and the cold end with an open circuit voltage Voc of 12 mV. From FIG. 10(c) it can be seen that there is a linear proportionality between the power output and the open circuit voltage if the temperature is varied. The Seebeck coefficient of the thermocouple gives a steady value near 140

$\mu VK^{-1}$, although the peak value of 190 $\mu VK^{-1}$ was achieved at a low temperature difference of 5K, as can be seen in FIG. 10 (d).

As demonstrated above, high room temperature figure-of-merit 2D/3D printable TE materials have been developed by bridging the TE grains with non-stoichiometric β-$Cu_{2-\delta}Se$ based inorganic binder (IB) through a facile printing-sintering process. A Seebeck coefficient (S) of more than 200 $\mu VK^{-1}$ with a very high TE power factor of more than 1500 $\mu Wm^{-1}K^{-2}$ for a p-type $Bi_{0.5}Sb_{1.5}Te_3$ (BST) printed material is obtained at room temperature. A high figure-of-merit of ZT>1.5 equivalent to its bulk value, is achieved in combination with a low thermal conductivity (κ) of about 0.4 to 0.5 W/m*K. Using the prepared printable material containing 10 wt % of IB for p-type legs and silver as n-type legs, a printed TE generator (print-TEG) of 4 thermocouples has been fabricated. An open-circuit voltage of 14 mV and a maximum power output of 1.7 µW is achieved for ΔT=40 K in the printTEG.

The invention claimed is:

1. An ink composition for printable thermoelectric materials, comprising:
   a precursor material for a thermoelectric material,
   a precursor material for an inorganic binder comprising a mixture of Cu, Se and S powder,
   an organic binder, and
   an organic solvent,
   wherein a molar ratio of the Cu powder to a total of the Se and S powder combined is 2:1 and wherein a molar ratio of the Se powder to the S powder expressed by a formula (1-x)Se:xS is in the range of 0≤x≤0.20; and
   wherein a weight ratio of the precursor material for a thermoelectric material to the precursor material for an inorganic binder expressed as [(1−y) thermoelectric material:y inorganic binder] is in a range of 0<y≤0.25.

2. The ink composition according to claim 1, wherein the precursor material for a thermoelectric material is a precursor material for a p-type thermoelectric material.

3. The ink composition according to claim 2, wherein the precursor material for a p-type thermoelectric material is a powder of Bi—Sb—Te alloy having a molar ratio of Te to Bi to Sb of 3:0.5:1.5.

4. The ink composition according to claim 2, wherein the precursor material for a p-type thermoelectric material is a powder of Bi—Sb—Te alloy having a molar ratio of Te to a total of the Bi and Sb combined of 3:2.

5. The ink composition according to claim 1, further comprising at least one additive selected from siliceous or aluminous materials and/or a liquid rheology dispersing additive.

6. The ink composition according to claim 5, wherein the at least one additive is selected from fumed silica.

7. The ink composition according to claim 1, wherein each of the Cu, Se and S powder has a particle size of 500 µm or less.

8. The ink composition according to claim 1, wherein the weight ratio of the precursor material for a thermoelectric material to the precursor material for an inorganic binder expressed as [(1−y) thermoelectric material:y inorganic binder] is in the range of 0.05≤y≤0.10.

9. A method for producing a flexible printed thermoelectric material, comprising the steps of:
   providing the ink composition according to claim 1;
      printing the ink composition onto a substrate to provide a printed film; and
      sintering the ink composition at a temperature of 200° C. to 500° C. for at least 60 seconds.

10. The method according to claim 9, wherein the step of sintering the ink composition is performed by photonic flash sintering the ink composition, and wherein the printed film is pressed after sintering.

11. The method according to claim 9, wherein the step of providing the ink composition comprises wet ball-milling of the precursor material for a thermoelectric material, the precursor material for an inorganic binder, the organic binder and the organic solvent.

12. The method according to claim 9, wherein the step of printing the ink composition onto the substrate is carried out by at least one selected from the group consisting of screen printing, doctor blading, airbrushing, inkjet printing and 3D-printing.

13. A flexible printed thermoelectric material obtainable by printing the ink composition according to claim 1 onto a substrate and sintering the ink composition at a temperature of 200° C. to 500° C. for at least 60 seconds, wherein the printed thermoelectric material comprises a $Cu_{2-\delta}S_xSe_{1-x}$ phase with 0≤x≤0.20 and 0≤ δ≤0.15.

14. The flexible printed thermoelectric material according to claim 13 having a thickness of 10 to 250 um.

15. A flexible printed thermoelectric generator comprising the printed thermoelectric material according to claim 13 as p-type legs.

16. The flexible printed thermoelectric generator according to claim 15, further comprising n-type legs made from an Ag—Se-based ink composition for n-type printable thermoelectric materials.

17. An article comprising the printed thermoelectric generator according to claim 15.

18. The article of claim 17, wherein the article is selected from a waste heat recovery device, a heat-flux sensor, or a wearable device.

* * * * *